United States Patent [19]
Gardner et al.

[11] Patent Number: 5,976,938
[45] Date of Patent: Nov. 2, 1999

[54] METHOD OF MAKING ENHANCEMENT-MODE AND DEPLETION-MODE IGFETS WITH DIFFERENT GATE THICKNESSES

[75] Inventors: Mark I. Gardner, Cedar Creek; Frederick N. Hause, Austin, both of Tex.

[73] Assignee: Advanced Micro Devices, Inc., Sunnyvale, Calif.

[21] Appl. No.: 08/844,925

[22] Filed: Apr. 21, 1997

[51] Int. Cl.$^6$ ................................................. H01L 21/8236
[52] U.S. Cl. ........................... 438/289; 438/549; 438/275
[58] Field of Search ........................... 438/289, 275–276, 438/519, 549, 217, 290–291, 521; 257/205

[56] References Cited

U.S. PATENT DOCUMENTS

| | | |
|---|---|---|
| 3,829,888 | 8/1974 | Hashimoto et al. . |
| 4,085,498 | 4/1978 | Rideout ..................................... 29/571 |
| 4,329,186 | 5/1982 | Kotecha et al. .......................... 148/1.5 |
| 4,725,871 | 2/1988 | Yamazaki ............................. 357/23.12 |
| 5,149,664 | 9/1992 | Shin et al. . |
| 5,300,443 | 4/1994 | Shimabukuro et al. .................. 437/34 |

OTHER PUBLICATIONS

Silicon Processing for the VLSI Era—vol. 3: The Submicron MOSFET, by S. Wolf, published by Lattice Press, Sunset Beach, CA, 1995, pp. 554–555.

*Primary Examiner*—Jey Tsai
*Attorney, Agent, or Firm*—Skjerven, Morrill, MacPherson, Franklin & Friel LLP

[57] ABSTRACT

A method of making enhancement-mode and depletion-mode IGFETs with different gate thicknesses is disclosed. The method includes providing a semiconductor substrate with first and second device regions, forming a first gate with a first thickness over the first device region, forming a second gate with a second thickness over the second device region, wherein the second thickness is substantially greater than the first thickness, implanting a dopant into the substrate and into the first and second gates to implant source and drain regions in the first device region and source and drain regions in the second device region, and transferring the dopant through the first gate into a first channel region in the first device region beneath the first gate without transferring essentially any of the dopant through the second gate into a second channel region in the second device region beneath the second gate, thereby providing depletion-mode doping in the first channel region while retaining enhancement-mode doping in the second channel region. The dopant can be implanted through the first gate into the first channel region. Alternatively, the dopant can be implanted into the first gate but not the first channel region and then diffused from the first gate into the first channel region. Advantageously, by employing different gate thicknesses, a single implant step can be used to provide lightly doped source/drain regions for enhancement and depletion-mode IGFETs as well as depletion-mode doping for channel regions of depletion-mode IGFETs (with thin gates) while retaining enhancement-mode doping for channel regions of enhancement-mode IGFETs (with thick gates).

38 Claims, 6 Drawing Sheets

METHOD OF MAKING ENHANCEMENT-MODE AND DEPLETION-MODE IGFETS WITH DIFFERENT GATE THICKNESSES

BACKGROUND OF THE INVENTION

1. Field of the Invention

The present invention relates to integrated circuit manufacturing, and more particularly to insulated-gate field-effect transistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in order to modulate the longitudinal conductance of the channel.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate. Thereafter, the gate provides an implant mask during the formation of source and drain regions by ion implantation, and the implanted dopants are driven-in and activated using a high-temperature anneal that would otherwise melt the aluminum.

An important parameter in IGFETs is the threshold voltage ($V_T$), which is the minimum gate voltage required to induce the channel. In general, the positive gate voltage of an N-channel device must be larger than some threshold voltage before a conducting channel is induced, and the negative gate voltage of a P-channel device must be more negative than some threshold voltage to induce the required positive charge (mobile holes) in the channel. There are, however, exceptions to this general rule. For example, depletion-mode devices already have a channel with zero gate voltage, and therefore are normally on. With N-channel depletion-mode devices a negative gate voltage is required to turn the devices off, and with P-channel depletion-mode devices a positive gate voltage is required to turn the devices off.

Depletion-mode devices are often used as nonlinear load circuits to provide a more favorable current-voltage relationship than is possible with linear load circuits using resistors or enhancement-mode devices. Enhancement-mode devices are often used as switches in digital circuits to prevent or allow the flow of electrical currents.

Enhancement-mode and depletion-mode devices are often fabricated on the same semiconductor substrate or chip to provide an integrated circuit such as a microprocessor. An array of devices can be fabricated in an integrated circuit layout, with some adjusted by implantation to obtain the desired enhancement-mode doping and others implanted to become depletion loads. A separate implantation step is typically used to provide some channel regions with depletion-mode doping while others retain enhancement-mode doping.

For example, prior to gate oxide formation, a masking layer can cover the device regions intended for enhancement-mode devices while providing openings over device regions intended for depletion-mode devices, and then the structure can be subjected to ion implantation so that only the exposed device regions are provided with depletion-mode doping.

Alternatively, after-gate implantations (such as wells, channel-stop doping, $V_T$ control, source/drain, etc.) can be used to provide depletion-mode doping after the gates are patterned. Studies indicate that after-gate implantations do not degrade the gate oxide integrity or the device characteristics. For example, U.S. Pat. No. 4,329,186 to Kotecha et al. discloses a technique for forming enhancement-mode and depletion-mode devices, in which after the gates are formed, a photoresist layer is patterned to cover some gates and expose other gates, and then ions are implanted through the exposed gates directly into the underlying channel regions to provide depletion-mode doping in these channel regions. Since the photoresist layer provides an implant mask, the channel regions underlying the gates covered by the photoresist layer retain enhancement-mode doping.

A drawback to these approaches, however, is that a separate implantation step is required to provide depletion-mode doping in selected channel regions.

A problem encountered in P-channel devices with polysilicon gates containing a high concentration of boron is that when a thin gate oxide is used, poor $V_T$ control may arise due to unwanted boron penetration into the gate oxide, or further, into the underlying channel region. It is reported that boron will penetrate gate oxides that are less than 125 angstroms thick during a 900° C. 30-minute post-implant anneal in nitrogen. It has also been found that the presence of fluorine in the gate oxide worsens the boron penetration problem. Such fluorine can be introduced into the gate oxide if boron difluoride ($BF_2$) is the implant species. Unfortunately, in some instances, the boron penetration may be sufficiently large to provide depletion-mode doping in channel regions intended for enhancement-mode devices.

Accordingly, a need exists for an improved method of making enhancement-mode and depletion-mode IGFETs in the desired device regions that reduces the number of implant steps.

SUMMARY OF THE INVENTION

An object of the present invention is provide an improved method of making enhancement-mode and depletion-mode IGFETs. A dopant from a single implant step provides source/drain doping for the enhancement-mode and depletion-mode devices as well as depletion-mode doping for a channel region of the depletion-mode device. This is accomplished using a relatively thin gate for the depletion-mode device and a relatively thick gate for the enhancement-mode device. The dopant is transferred through the thin gate to provide depletion-mode doping in the underlying channel region, whereas essentially none of the dopant is transferred through the thick gate to retain enhancement-mode doping in the underlying channel region.

In accordance with one aspect of the invention, a method of making enhancement-mode and depletion-mode IGFETs includes providing a semiconductor substrate with first and second device regions, forming a first gate with a first thickness over the first device region, forming a second gate with a second thickness over the second device region, wherein the second thickness is substantially greater than the first thickness, implanting a dopant into the substrate and into the first and second gates to implant source and drain regions in the first device region and source and drain regions in the second device region, and transferring the dopant through the first gate into a first channel region in the first device region beneath the first gate without transferring essentially any of the dopant through the second gate into a second channel region in the second device region beneath the second gate, thereby providing depletion-mode doping in the first channel region while retaining enhancement-mode doping in the second channel region.

The dopant can be implanted through the first gate into the first channel region. Alternatively, the dopant can be implanted into the first gate but not the first channel region and then diffused from the first gate into the first channel region. Preferably, the dopant provides lightly doped source and drain regions for the first and second device regions, and essentially all depletion-mode doping for the first channel region.

The first and second gates can be formed with different gate thicknesses using an additive or subtractive process. In the additive process, a gate material is etched to form the first gate and a lower level of the second gate, and then an upper layer of the second gate is formed on the lower level of the second gate. In the subtractive process, a gate material is etched to form a first pillar and the second gate, and then an upper level of the first pillar is removed to form the first gate.

Advantageously, by employing different gate thicknesses, a single implant step can be used to provide lightly doped source/drain regions for the enhancement-mode and depletion-mode IGFETs as well as depletion-mode doping for channel regions of the depletion-mode IGFETs (with thin gates) while retaining enhancement-mode doping for channel regions of the enhancement-mode IGFETs (with thick gates).

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
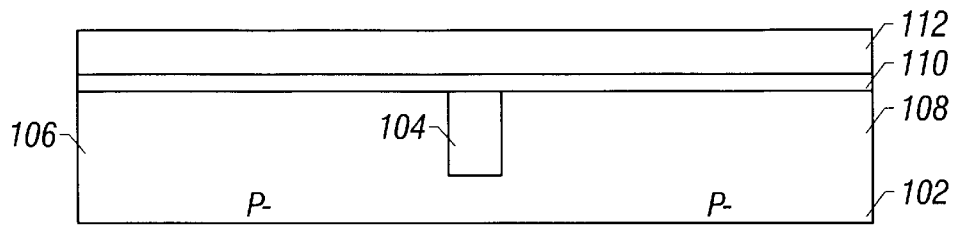
FIGS. 1A–1I show cross-sectional views of successive process steps for making enhancement-mode and depletion-mode IGFETs with different gate thicknesses in accordance with a first embodiment of the invention.

In the drawings, depicted elements are not necessarily drawn to scale and like or similar elements may be designated by the same reference numeral throughout the several views.

FIGS. 1A–1I show cross-sectional views of successive process steps for making enhancement-mode and depletion-mode IGFETs with different gate thicknesses in accordance with a first embodiment of the invention.

In FIG. 1A, silicon substrate 102 suitable for integrated circuit manufacture is provided. Substrate 102 includes a P-type epitaxial surface layer with a planar top surface disposed on a P+ base layer (not shown). The epitaxial surface layer has a boron background concentration on the order of $1 \times 10^{16}$ atoms/cm$^3$, a <100> orientation and a resistivity of 12 ohm-cm. Trench oxide 104, composed of silicon dioxide (SiO$_2$), provides dielectric isolation between devices regions 106 and 108 in substrate 102. A blanket layer of gate oxide 110, composed of silicon dioxide, is formed on the top surface of substrate 102 using tube growth at a temperature of 700 to 1000° C. in an O$_2$ containing ambient. Gate oxide 110 has a thickness in the range of 30 to 100 angstroms. Thereafter, polysilicon layer 112 is deposited by low pressure chemical vapor deposition on the top surface of gate oxide 110. Polysilicon layer 112 is undoped and has a thickness of 2000 angstroms. If desired, polysilicon layer 112 can be doped in situ as deposition occurs, or doped immediately after deposition by implanting arsenic with a dosage in the range of $1 \times 10^{15}$ to $5 \times 10^{15}$ atoms/cm$^2$ and an energy in the range of 2 to 10 kiloelectron-volts. However, it is generally preferred that polysilicon layer 112 be initially doped during a later processing step.

Figure 1B:
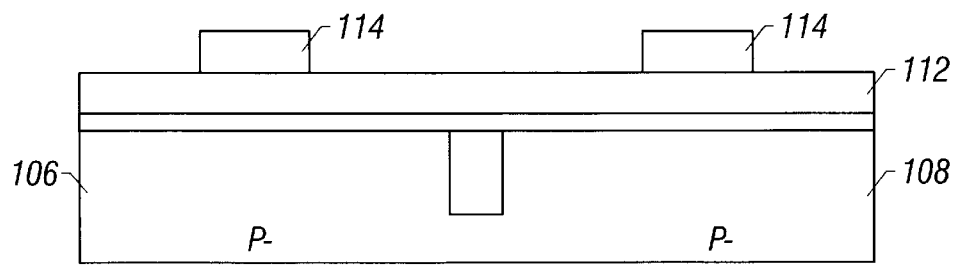

In FIG. 1B, photoresist layer 114 is deposited on polysilicon layer 112. A photolithographic system, such as a step and repeat optical projection system which generates deep ultraviolet light from a mercury-vapor lamp, uses a first reticle to irradiate photoresist layer 114 with a first image pattern. Thereafter, the irradiated portions of photoresist layer 114 are removed, and photoresist layer 114 includes openings above selected portions of device regions 106 and 108.

Figure 1C:
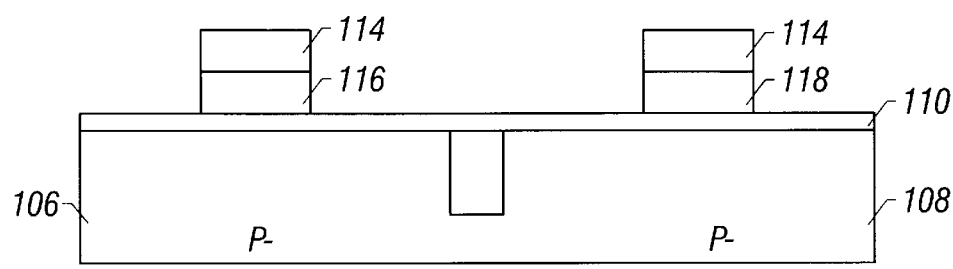

In FIG. 1C, an anisotropic dry etch is applied using photoresist layer 114 as an etch mask. Photoresist layer 114 protects the underlying regions of polysilicon layer 112, and the etch removes the regions of polysilicon layer 112 beneath the openings in photoresist layer 114. The etch is highly selective of polysilicon layer 112 with respect to gate oxide 110, so only a negligible amount of gate oxide 110 is removed and substrate 102 is unaffected. The etch forms pillar 116 from the unetched portion of polysilicon layer 112 over device region 106, and gate 118 from the unetched portion of polysilicon layer 112 over device region 108. Pillar 116 and gate 118 each have opposing vertical edges (or sidewalls) separated by a length of 3500 angstroms, and a thickness (or height above the underlying gate oxide 110) of 2000 angstroms. Pillar 116 includes an upper level on a gate. The upper level shall be removed to form a gate over device region 106, as described below.

Figure 1D:
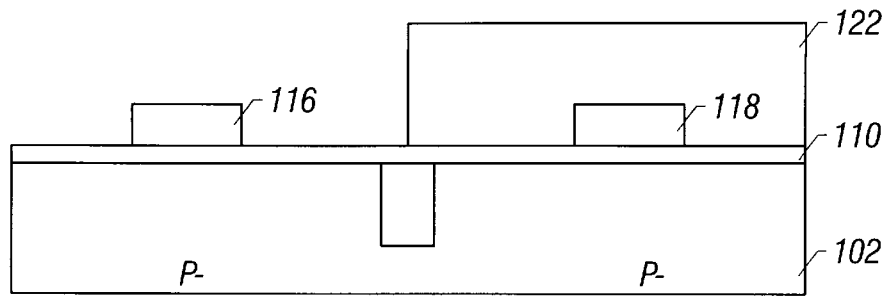

In FIG. 1D, photoresist layer 114 is stripped, and photoresist layer 122 is deposited over substrate 102. The photolithographic system uses a second reticle to irradiate photoresist layer 122 with a second image pattern. Thereafter, the irradiated portions of photoresist layer 122 are removed so that photoresist layer 122 includes an opening above pillar 116 while photoresist layer 122 covers gate 118.

Figure 1E:
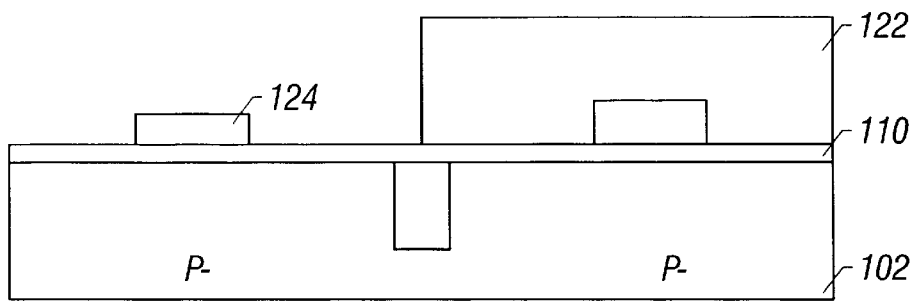

In FIG. 1E, a dry etch is applied using photoresist layer 122 as an etch mask. The dry etch is highly selective of polysilicon with respect to silicon dioxide, so only a negligible amount of gate oxide 110 is removed and substrate 102 is unaffected. The etch removes the upper 1500 angstroms of pillar 116 while leaving the lower 500 angstroms of pillar 116 intact, thereby removing the upper level of pillar 116 and forming gate 124 from the remaining lower level of pillar 116.

Figure 1F:
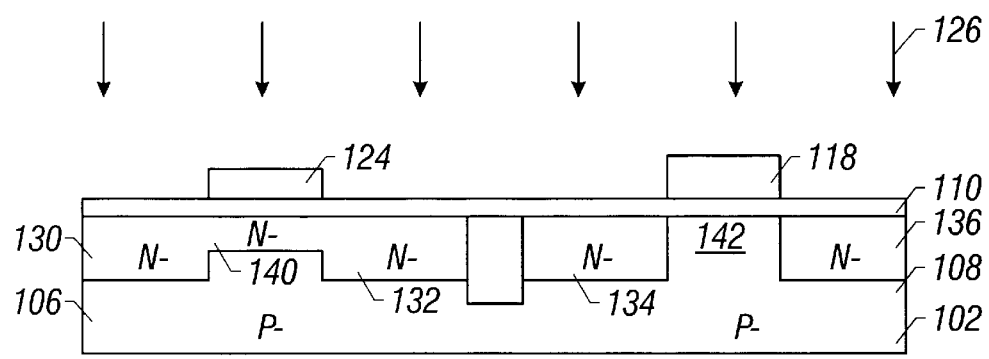

In FIG. 1F, photoresist layer 122 is stripped, lightly doped source and drain regions are implanted into the device regions, and depletion-mode doping is provided for a channel region in one of the device regions (but not the other device region) by subjecting the structure to ion implantation of phosphorus, indicated by arrows 126, at a dose in the range of $1 \times 10^{13}$ to $5 \times 10^{14}$ atoms/cm$^2$ and an energy of 30 to 60 kiloelectron-volts. As a result, lightly doped source/drain regions 130 and 132 are implanted into device region 106 outside gate 124 and are self-aligned to the opposing vertical edges of gate 124, and lightly doped source/drain regions 134 and 136 are implanted into device region 108 outside gate 118 and are self-aligned to the opposing vertical edges of gate 118. The phosphorus is also implanted into gates 118 and 124. A substantial amount of the phosphorus that impinges upon gate 124 transfers through gate 124 and gate oxide 110 and is implanted into channel region 140; however, essentially all of the phosphorus that impinges upon gate 118 is implanted into gate 118 and does not reach channel region 142. That is, the phosphorus is implanted to essentially identical depths beneath the top surfaces of gates 124 and 118, the top surface of gate 124 is substantially closer to substrate 102 than is the top surface of gate 118, a substantial amount of the phosphorus is implanted to a depth that is greater than the thickness of gate 124, and essentially all of the phosphorus is implanted to a depth that is less than the thickness of gate 118. Therefore, the implant step provides depletion-mode doping for channel region 140 while retaining enhancement-mode doping for channel region 142. In addition, the peak concentration of the phosphorus occurs in the lower half of gate 124 and in the upper half of gate 118.

As is seen, channel region 140 is in device region 106 beneath gate 124 and is adjacent to lightly doped source/drain regions 130 and 132, and channel region 142 is in device region 108 beneath gate 118 and is adjacent to lightly doped source/drain regions 134 and 136. Lightly doped source/drain regions 130, 132, 134 and 136 are doped N− with an phosphorus concentration in the range of about $1 \times 10^{17}$ to $1 \times 10^{18}$ atoms/cm$^3$, channel region 140 is doped N− with an phosphorus concentration in the range of about $5 \times 10^{16}$ to $5 \times 10^{17}$ atoms/cm$^3$, and channel region 142 continues to be doped P− with a boron concentration of about $1 \times 10^{16}$ atoms/cm$^3$. Preferably, the phosphorus concentration in channel region 140 is substantially less than that of lightly doped source/drain regions 130 and 132.

Figure 1G:
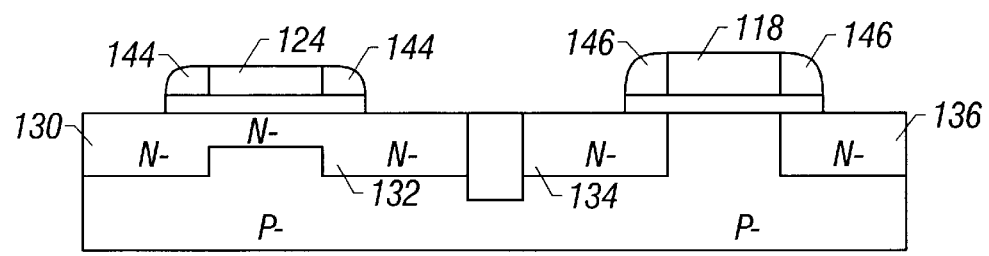

In FIG. 1G, an oxide layer with a thickness of 2500 angstroms is conformally deposited over the exposed surfaces by plasma enhanced chemical vapor deposition at a temperature in the range of 300 to 450° C. Thereafter, the structure is subjected to an anisotropic reactive ion etch that forms oxide spacers 144 adjacent to the opposing vertical edges of gate 124 and oxide spacers 146 adjacent to the opposing vertical edges of gate 118. Spacers 144 cover portions of lightly doped source/drain regions 130 and 132, and spacers 146 cover portions of lightly doped source/drain regions 134 and 136.

Figure 1H:
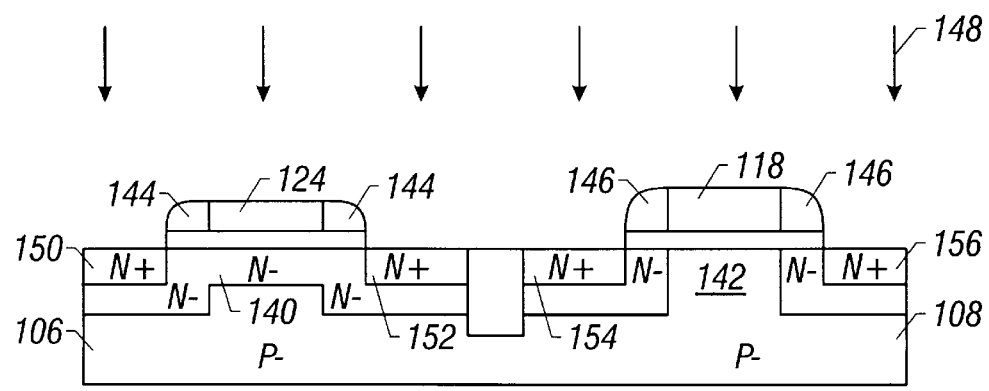

In FIG. 1H, heavily doped source and drain regions are implanted into the device regions by subjecting the structure to ion implantation of arsenic, indicated by arrows 148, at a dose in the range of $1 \times 10^{15}$ to $5 \times 10^{15}$ atoms/cm$^2$ and an energy of 5 kiloelectron-volts, using gate 124 and spacers 144 as an implant mask for device region 106, and using gate 118 and spacers 146 as an implant mask for device region 108. As a result, heavily doped source/drain regions 150 and 152 are implanted in device region 106 and are self-aligned to the outside edges of spacers 144, and heavily doped source/drain regions 154 and 156 are implanted in device region 108 and are self-aligned to the outside edges of spacers 146. Heavily doped source/drain regions 150, 152, 154 and 156 are doped N+ with an arsenic concentration in the range of about $1 \times 10^{18}$ to $1 \times 10^{20}$ atoms/cm$^3$.

Figure 1I:
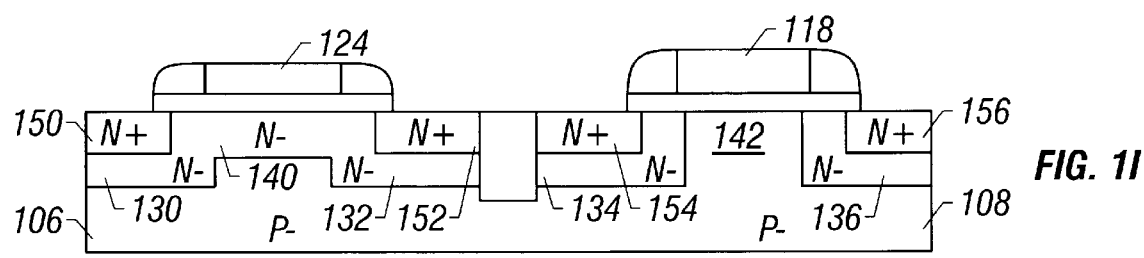

In FIG. 1I, the device is annealed to remove crystalline damage and to drive-in and activate the implanted dopants by applying a rapid thermal anneal on the order of 950 to 1050° C. for 10 to 30 seconds. Source regions 130 and 150 form a source and drain regions 132 and 152 form a drain for a depletion-mode N-channel IGFET in device region 106. Similarly, source regions 134 and 154 form a source and drain regions 136 and 156 form a drain for an enhancement-mode N-channel IGFET in device region 108. Since the dopants diffuse both vertically and laterally, the lightly doped source and drain regions extend slightly beneath the gates, and the heavily doped source and drain regions extend slightly beneath the spacers. Of importance, little or no phosphorus or arsenic diffuses from gate 124 into channel region 140, or from gate 118 into channel region 142. Therefore, essentially all depletion-mode doping for channel region 140 is provided by phosphorus, indicated by arrows 126, during a single implant step that also provides the lightly doped source/drain regions. In this manner, the thin gate provides for a depletion-mode device and the thick gate provides for an enhancement-mode device.

FIGS. 2A–2K show cross-sectional views of successive process steps for forming enhancement-mode and depletion-mode IGFETs with different gate thicknesses in accordance with a second embodiment of the invention. The primary difference between the first and second embodiments is that in the first embodiment, the depletion-mode doping is implanted through the thin gate into the underlying channel region, whereas in the second embodiment, the depletion-mode doping is diffused from the thin gate into the underlying channel region. Another difference is that in the first embodiment the upper level of the pillar is etched, whereas in the second embodiment the upper level of the pillar is consumed by thermal oxidation. Still another difference is that the conductivity types are reversed. Unless otherwise noted, the elements for the second embodiment (e.g., substrate 202, gate oxide 210, etc.) are similar to elements of the first embodiment (e.g., substrate 102, gate oxide 110, etc.), and the description of related elements and process steps need not be repeated.

Figure 2A:
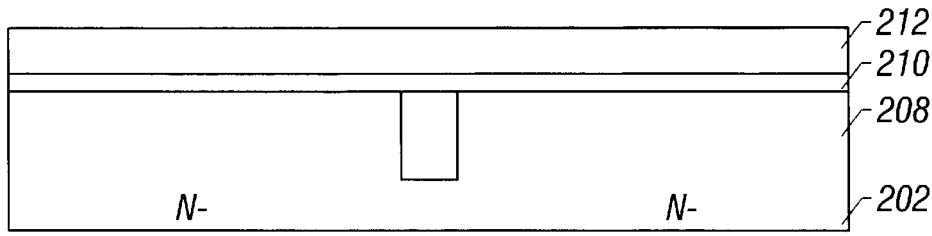
FIGS. 2A–2K show cross-sectional views of successive process steps for making enhancement-mode and depletion-mode IGFETs with different gate thicknesses in accordance with a second embodiment of the invention.

In FIG. 2A, silicon substrate 202 suitable for integrated circuit manufacture is provided. Substrate 202 includes an N− type well (shown) with a planar top surface. The N-well is in a P− type epitaxial surface layer (not shown) disposed on a P+ base layer (not shown). The N-well has a phosphorus background concentration on the order of $1 \times 10^{16}$ atoms/cm$^3$, a <100> orientation and a resistivity of 12 ohm-cm. Trench oxide 204 provides dielectric isolation between devices regions 206 and 208 in substrate 202. A blanket layer of gate oxide 210 with a thickness in the range of 30 to 100 angstroms is grown on the top surface of substrate 202. Thereafter, polysilicon layer 212 is deposited on the top surface of gate oxide 210. Polysilicon layer 212 is undoped and has a thickness of 2000 angstroms.

Figure 2B:
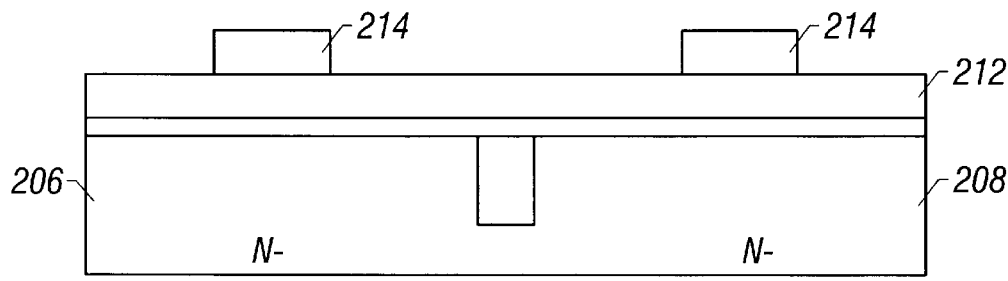

In FIG. 2B, photoresist layer 214 is deposited on polysilicon layer 212. A photolithographic system uses a first reticle to irradiate photoresist layer 214 with a first image pattern. Thereafter, the irradiated portions of photoresist layer 214 are removed, and photoresist layer 214 includes openings above selected portions of device regions 206 and 208.

Figure 2C:
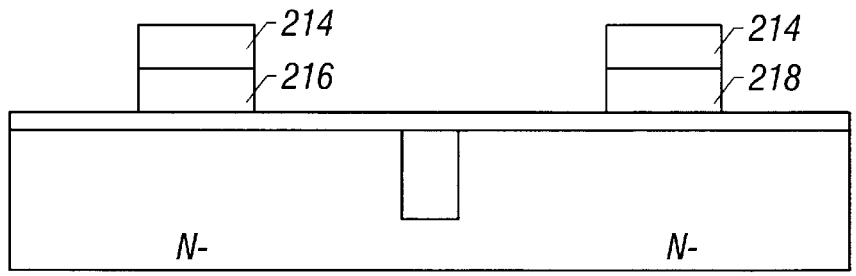

In FIG. 2C, an anisotropic dry etch is applied using photoresist layer 214 as an etch mask. The etch forms pillar 216 from the unetched portion of polysilicon layer 212 over device region 206, and gate 218 from the unetched portion of polysilicon layer 212. over device region 208. Pillar 216 and gate 218 each have opposing vertical edges (or sidewalls) separated by a length of 3500 angstroms, and a thickness (or height above the underlying gate oxide 210) of 2000 angstroms. Pillar 216 includes an upper level on a gate. The upper level shall be removed to form a gate over device region 206, as described below.

Figure 2D:
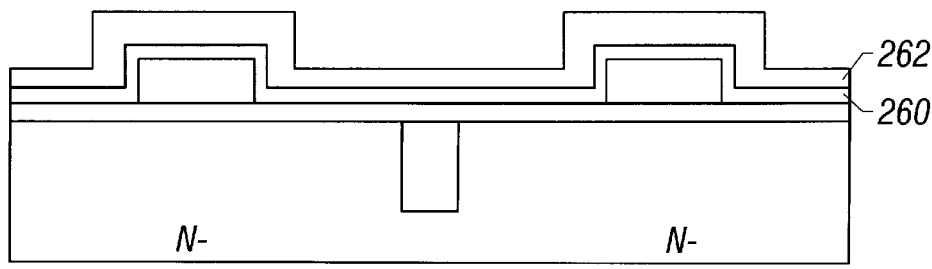

In FIG. 2D, photoresist layer 214 is stripped, a conformal oxide layer 260 with a thickness of 100 angstroms is deposited over the exposed surfaces, and then a conformal nitride layer 262, composed of silicon nitride ($Si_3N_4$), with a thickness of 300 angstroms, is deposited over oxide layer 260.

Figure 2E:
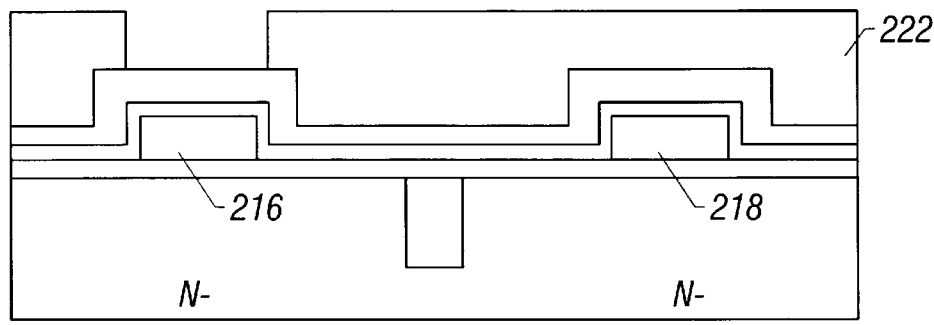

In FIG. 2E, photoresist layer 222 is deposited over substrate 202. The photolithographic system uses a second reticle to irradiate photoresist layer 222 with a second image pattern. Thereafter, the irradiated portions of photoresist layer 222 are removed so that photoresist layer 222 includes an opening above pillar 216 while photoresist layer 222 covers gate 218.

Figure 2F:
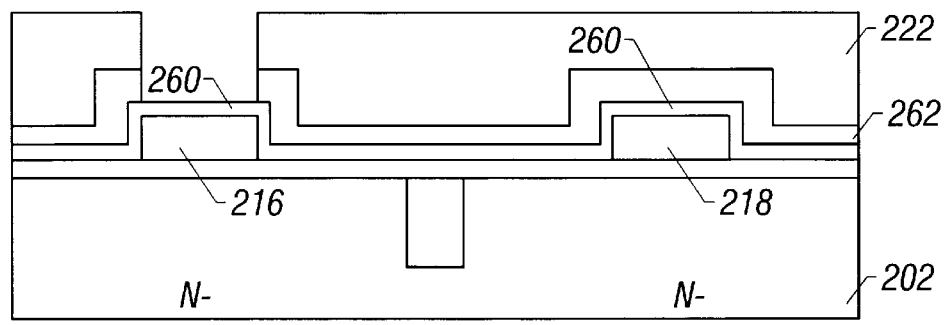

In FIG. 2F, a dry etch is applied using photoresist layer 222 as an etch mask. The dry etch is highly selective of silicon nitride with respect to silicon dioxide, so only a negligible amount of oxide layer 260 is removed, and pillar 216, gate 218 and substrate 202 are unaffected. The etch removes the exposed portions of nitride layer 262 so that the portion of oxide layer 260 on pillar 216 is exposed whereas the portion of oxide layer 260 on gate 218 is covered.

Figure 2G:
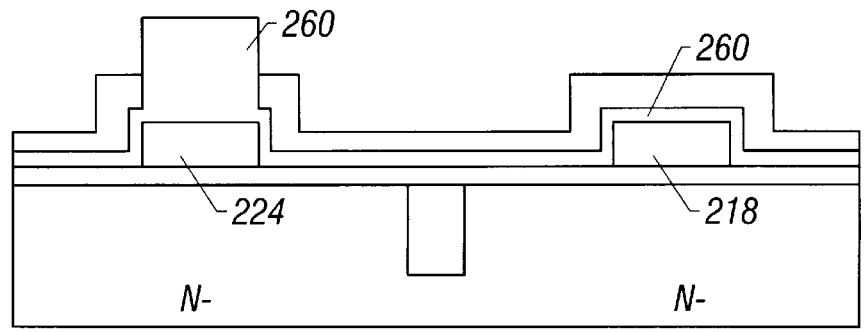

In FIG. 2G, photoresist layer 222 is stripped, and the portion of oxide layer 260 on pillar 216 is grown using a low-temperature wet thermal oxidation process. The oxidation reaction occurs at the polysilicon/oxide interface. Therefore, as the oxide grows, polysilicon is consumed and the thickness of pillar 216 decreases. Based on the relative densities and molecular weights of polysilicon and silicon dioxide, the amount of polysilicon consumed is about 44% of the thickness of the grown oxide. The thermal oxidation consumes the upper 1500 angstroms of pillar 216 while leaving the lower 500 angstroms of pillar 216 intact, thereby removing the upper level of pillar 216 and forming gate 224 from the remaining lower level of pillar 216. No thermal oxidation occurs on gate 218 since the portion of oxide layer 260 on gate 218 is covered by nitride layer 262 and therefore is not exposed to the oxidizing atmosphere. As a result, the thickness of gate 218 remains 2000 angstroms.

Figure 2H:
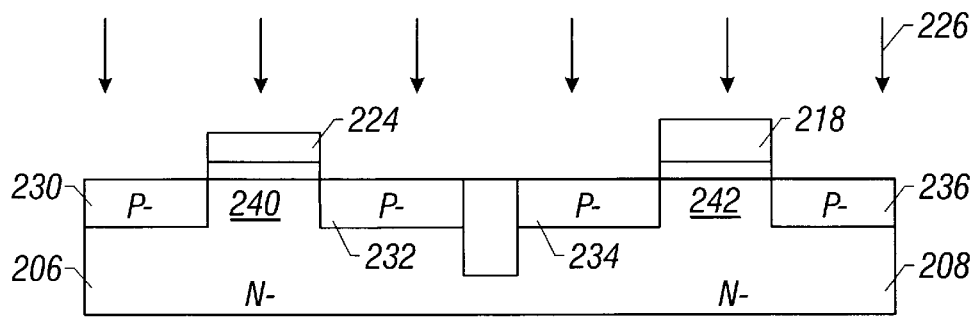

In FIG. 2H, nitride layer 262 and oxide layer 260 and gate oxide 210 (outside gates 218 and 224) are stripped, and lightly doped source and drain regions are implanted into the device regions, without providing depletion-mode doping for any channel regions, by subjecting the structure to ion implantation of boron, indicated by arrows 226, at a dose in the range of $1\times10^{13}$ to $5\times10^{14}$ atoms/cm² and an energy of 10 to 15 kiloelectron-volts. As a result, lightly doped source/drain regions 230 and 232 are implanted into device region 206 outside gate 224 and are self-aligned to the opposing vertical edges of gate 224, and lightly doped source/drain regions 234 and 236 are implanted into device region 208 outside gate 218 and are self-aligned to the opposing vertical edges of gate 218. Essentially all of the boron that impinges upon gates 218 and 224 is implanted into gates 218 and 224 without being implanted into the underlying channel regions 240 and 242. That is, the boron is implanted to essentially identical depths beneath the top surfaces of gates 224 and 218, and although the top surface of gate 224 is substantially closer to substrate 202 than is the top surface of gate 218, essentially all of the boron is implanted to a depth that is less than the thickness of gate 224. Therefore, enhancement-mode doping is retained for channel regions 240 and 242, although the boron in gate 218 is substantially closer to channel region 240 than the boron in gate 224 is to channel region 242. In addition, the peak concentration of the boron occurs in the lower half of gate 224 but in the upper half of gate 218. Lightly doped source/drain regions 230, 232, 234 and 236 are doped P− with a boron concentration in the range of about $1\times10^{17}$ to $1\times10^{18}$ atoms/cm³, and channel regions 240 and 242 continue to be doped N− with a phosphorus concentration of about $1\times10^{16}$ atoms/cm³.

Figure 2I:
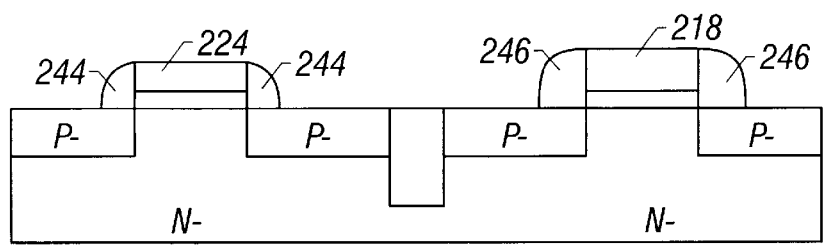

In FIG. 2I, an oxide layer with a thickness of 2500 angstroms is conformally deposited over the exposed surfaces, and then the structure is subjected to an anisotropic reactive ion etch that forms oxide spacers 244 adjacent to the opposing vertical edges of gate 224 and oxide spacers 246 adjacent to the opposing vertical edges of gate 218.

Figure 2J:
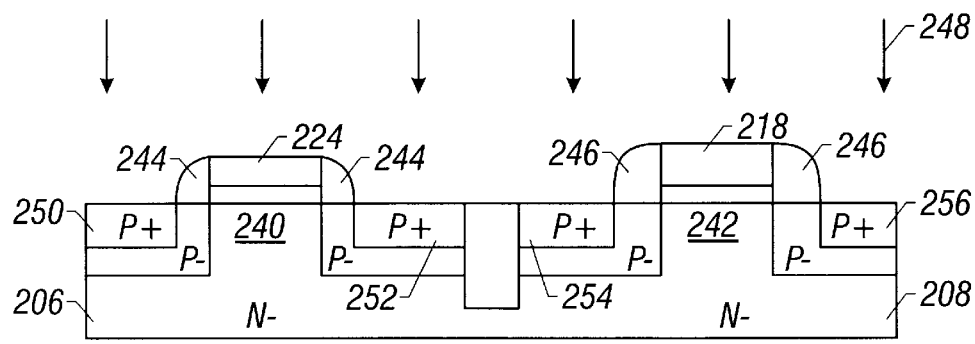

In FIG. 2J, heavily doped source and drain regions are implanted into the device regions by subjecting the structure to ion implantation of boron, indicated by arrows 248, at a dose in the range of $1\times10^{15}$ to $5\times10^{15}$ atoms/cm² and an energy of 5 kiloelectron-volts, using gate 224 and spacers 244 as an implant mask for device region 206, and using gate 218 and spacers 246 as an implant mask for device region 208. As a result, heavily doped source/drain regions 250 and 252 are implanted in device region 206 and are self-aligned to the outside edges of spacers 244, and heavily doped source/drain regions 254 and 256 are implanted in device region 208 and are self-aligned to the outside edges of spacers 246. Furthermore, channel regions 240 and 242 retain enhancement-mode doping. Heavily doped source/drain regions 250, 252, 254 and 256 are doped P+ with a boron concentration in the range of about $1\times10^{18}$ to $1\times10^{20}$ atoms/cm³.

Figure 2K:
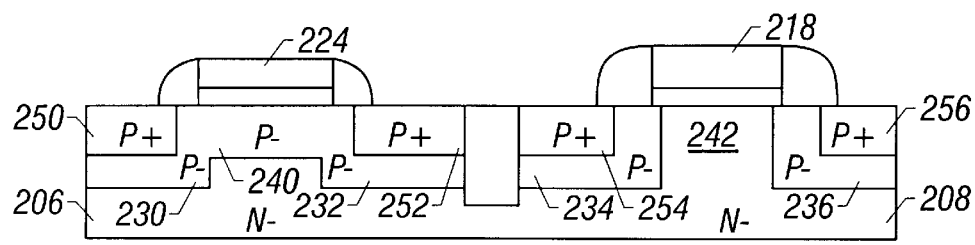

In FIG. 2K, the device is annealed to remove crystalline damage and to drive-in and activate the implanted dopants, and to provide depletion-mode doping in one of the channel regions (but not the other channel region) by applying a rapid thermal anneal on the order of 950 to 1050° C. for 10 to 30 seconds. The implanted boron rapidly diffuses both laterally and vertically. The boron, indicated by arrows 248, has been implanted into gate 224 with a sufficiently shallow depth that essentially none of it diffuses from gate 224 into channel region 240. Similarly, the boron, indicated by arrows 226 and 248, has been implanted into gate 218 with a sufficiently shallow depth that essentially none of it diffuses from gate 218 into channel region 242. However, the boron indicated by arrows 226 has been implanted into gate 224 with a sufficiently large depth that a substantial amount of it diffuses from gate 224 into channel region 240. As a result, depletion-mode doping is provided for channel region 240, and enhancement-mode doping is retained for channel region 242. In particular, channel region 240 is doped P− with a boron concentration in the range of about $5\times10^{16}$ to $5\times10^{17}$ atoms/cm³, and channel region 242 continues to be doped N− with a phosphorus concentration of about $1\times10^{16}$ atoms/cm³. Preferably, the boron concentration in channel region 240 is substantially less than that of lightly doped source/drain regions 230 and 232. Furthermore, source regions 230 and 250 form a source and drain regions 232 and 252 form a drain for a depletion-mode P-channel IGFET in device region 206, and similarly, source regions 234 and 254 form a source and drain regions 236 and 256 form a drain for an enhancement-mode P-channel IGFET in device region 208. In addition, the lightly doped source and drain regions extend slightly beneath the gates, and the heavily (loped source and drain regions extend slightly beneath the spacers. Therefore, essentially all depletion-mode doping for channel region 240 is provided by boron, indicated by arrows 226, from a single implant step that also provides the lightly doped source/drain regions, by way of diffusion of the implanted boron from the overlying gate. In this manner, the thin gate provides for a depletion-mode device and the thick gate provides for an enhancement-mode device.

Further processing steps in the fabrication of IGFETs typically include forming salicide contacts on the gates, sources and drains, forming a thick oxide layer over the device regions, forming contact windows in the oxide layer to expose the salicide contacts, forming interconnect metallization in the contact windows, and forming a passivation layer over the metallization. In addition, earlier or subsequent high-temperature process steps can be used to supplement or replace the anneal step to provide the desired anneal, activation, and drive-in functions. These further processing steps are conventional and need not be repeated herein. Likewise the principal processing steps disclosed herein may be combined with other steps apparent to those skilled in the art.

In the previous embodiments, the difference in gate thicknesses has been provided by a subtractive process, in which a gate material is etched to form a first pillar and the second gate, and then an upper level of the first pillar is removed to form the first gate. Alternatively, if desired, the difference in gate thicknesses can be provided by an additive process, in which a gate material is etched to form the first gate and a lower level of the second gate, and then an upper layer of the second gate is formed on the lower level of the second gate to form the second gate. Several examples of such additive processes are listed below.

In a first additive process, after the first gate and the lower level of the second gate are formed, an insulating layer is deposited over the structure and polished until the first gate and the lower level of the second gate are exposed, a layer of conductive material is deposited over the structure and on the first gate, the lower level of the second gate and the insulating layer, a masking layer is deposited on the conductive material, an opening is formed in the masking layer above the first gate, and a region of the conductive material on the first gate is etched through the opening in the masking layer such that the conductive material that remains on the lower level of the second gate provides the upper level of the second gate.

In a second additive process, after the first gate and the lower level of the second gate are formed, an insulating layer is deposited over the first gate and the lower level of the second gate, an opening is formed in the insulating layer that exposes the lower level of the second gate without exposing the first gate, a layer of conductive material is deposited on the insulating layer and into the opening in the insulating layer without being deposited on the first gate, and the conductive material is polished to remove the conductive material outside the opening in the insulating layer such that the conductive material that remains in the opening in the insulating layer provides the upper level of the second gate.

In a third additive process, after the first gate and the lower level of the second gate are formed, an insulating layer is deposited over the first gate and the lower level of the second gate, an opening is formed in the insulating layer that exposes the lower level of the second gate without exposing the first gate, and epitaxial silicon is selectively deposited in the opening in the insulating layer without being deposited over the first gate to provide the upper level of the second gate. It should be noted that there are basically two types of selective epitaxial deposition processes. In "Type 1" processes, epitaxial growth occurs only on the exposed silicon and no growth occurs on the exposed oxide. In "Type 2" processes, epitaxial growth occurs on both the exposed silicon and the exposed oxide. In the third additive process, the epitaxial silicon is deposited on the exposed polysilicon using a Type 1 process. $SiCl_4$ and $SiHCl_3$ provide suitable silicon sources. $SiH_2Cl_2$ and $SiH_4$ also provide suitable silicon sources if HCl or $Cl_2$ is added to the reaction. Furthermore, bromine based silicon compounds such as $SiHBr_3$ and $SiBr_4$ have shown improved selectivity over their chlorinated counterparts. Factors that enhance the selective nature of a Type 1 process include reduced pressure, increased temperature, and decreased mole fraction of the silicon source in the gas stream. Selective deposition of epitaxial silicon is well-known in the art.

As still another alternative, the difference in gate thicknesses can be provided by depositing different layers of gate material on different portions of the gate insulator, with the different layers having different thicknesses, and then etching the different layers to form the gates.

The present invention includes numerous variations to the embodiments described above. For instance, gates can include various conductors such as polysilicon, epitaxial silicon, conductive metals, and conductive metal silicides. The gate insulator and spacers can be various dielectrics such as silicon dioxide, silicon nitride and silicon oxynitride. The device regions can be isolated using various techniques such as LOCOS oxidation, or alternatively need not be isolated from one another. The photoresist layers can pattern other masking layers to be used as an etch mask and/or implant mask.

The depletion-mode doping can be provided by a combination of implantation through the thin gate and subsequent diffusion from the thin gate, or by a combination of several implant steps such as a first implant step that forms lightly doped source/drain regions and a second implant step that forms heavily doped source/drain regions, or by a single implant step that forms heavily doped source/drain regions before or after the lightly doped source/drain regions are formed, or by a single implant step that provides all source/drain doping. Suitable N-type dopants include arsenic and phosphorus (although it may be difficult to diffuse any appreciable amount of arsenic or phosphorus through the gate insulator); suitable P-type dopants include boron $B_{10}$, boron $B_{11}$, and $BF_X$ species such as $BF_2$.

Furthermore, the present invention can be used to provide enhancement-mode IGFETs with different threshold voltages as well as depletion-mode IGFETs with different threshold voltages. In both instances, the difference in threshold voltages is due to the different gate thicknesses.

The invention is particularly well-suited for fabricating N-channel MOSFETs, P-channel MOSFETs and other types of IGFETs, particularly for high-performance microprocessors where high circuit density is essential. Although a single pair of enhancement-mode and depletion-mode devices has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making enhancement-mode and depletion-mode IGFETs, comprising the steps of:
    providing a semiconductor substrate with first and second device regions;
    forming a first gate with a first thickness over the first device region;
    forming a second gate with a second thickness over the second device region, wherein the second thickness is substantially greater than the first thickness;
    implanting a dopant into the substrate and into the first and second gates to implant source and drain regions in the first device region and source and drain regions in the second device region; and
    transferring the dopant through the first gate into a first channel region in the first device region beneath the first gate without transferring essentially any of the dopant through the second gate into a second channel region in the second device region beneath the second gate, thereby providing depletion-mode doping in the first channel region while retaining enhancement-mode doping in the second channel region.

2. The method of claim 1, wherein implanting the dopant into the substrate includes implanting the dopant through the first gate into the first channel region, thereby transferring the dopant through the first gate into the first channel region.

3. The method of claim 1, wherein implanting the dopant into the substrate excludes implanting essentially any of the dopant through the first gate into the first channel region, and transferring the dopant through the first gate into the first channel region includes applying heat to diffuse the dopant from the first gate into the first channel region.

4. The method of claim 1, wherein forming the first and second gates includes depositing a gate material over the substrate, etching the gate material to form the first gate and a lower level of the second gate, and then forming an upper level of the second gate on the lower level of the second gate to form the second gate.

5. The method of claim 1, wherein forming the first and second gates includes depositing a gate material over the substrate, etching the gate material to form a first pillar and the second gate, and then removing an upper level of the first pillar to form the first gate.

6. The method of claim 1, wherein the dopant provides essentially all depletion-mode doping for the first channel region.

7. The method of claim 1, wherein the source and drain regions in the first device region are substantially aligned with opposing sidewalls of the first gate, and the source and drain regions in the second device region are substantially aligned with opposing sidewalls of the second gate.

8. The method of claim 1, including implanting the source and drain regions in the first and second device regions as lightly doped source and drain regions, forming spacers adjacent to opposing sidewalls of the first and second gates, and then implanting heavily doped source and drain regions in the first and second device regions without doping the first and second channel regions.

9. A method of making enhancement-mode and depletion-mode IGFETs, comprising the steps of:
    providing a semiconductor substrate with first and second device regions;
    forming a gate insulator on the first and second device regions;
    forming a first gate with a first thickness on the gate insulator over the first device region;
    forming a second gate with a second thickness on the gate insulator over the second device region, wherein the second thickness is substantially greater than the first thickness;
    implanting a dopant into the first and second gates, into the first device region outside the first gate, and into the second device region outside the second gate, to implant lightly doped source and drain regions in the first device region outside the first gate and to implant lightly doped source and drain regions in the second device region outside the second gate; and
    transferring the dopant through the first gate into a first channel region in the first device region beneath the first gate without transferring essentially any of the dopant through the second gate into a second channel region in the second device region beneath the second gate, thereby providing depletion-mode doping in the first channel region while retaining enhancement-mode doping in the second channel region due to a difference between the first and second thicknesses.

10. The method of claim 9, wherein implanting the dopant into the substrate includes implanting the dopant through the first gate into the first channel region, thereby transferring the dopant through the first gate into the first channel region and providing essentially all depletion-mode doping for the first channel region.

11. The method of claim 9, wherein implanting the dopant into the substrate excludes implanting essentially any of the dopant through the first gate into the first channel region, and transferring the dopant through the first gate into the first channel region includes applying heat to diffuse the dopant from the first gate into the first channel region to provide essentially all depletion-mode doping for the first channel region.

12. The method of claim 9, wherein transferring the dopant through the first gate into the first channel region includes implanting the dopant through the first gate into the first channel region and then diffusing the dopant from the first gate into the first channel region to provide essentially all depletion-mode doping for the first channel region.

13. The method of claim 9, wherein forming the first and second gates includes:
    depositing a gate material on the gate insulator;
    forming a masking layer over the gate material;
    etching the gate material through openings in the masking layer to form the first gate and a lower level of the second gate; and then
    forming an upper level of the second gate on the lower level of the second gate, wherein the upper level of the second gate provides a difference between the first and second thicknesses.

14. The method of claim 13, wherein forming the upper level of the second gate includes:
    depositing an insulating layer over the first gate and the lower level of the second gate;
    polishing the insulating layer until the first gate and the lower level of the second gate are exposed;
    depositing a conductive material on the first gate and the lower level of the second gate and the insulating layer;
    depositing a second masking layer over the first gate and the lower level of the second gate;

forming an opening in the second masking layer above the first gate while the masking layer covers the lower level of the second gate; and etching the conductive material through the opening in the second masking layer using the second masking layer as an etch mask for the conductive material on the lower level of the second gate.

15. The method of claim 13, wherein forming the upper level of the second gate includes:

depositing an insulating layer over the first gate and the lower level of the second gate;

forming an opening in the insulating layer that exposes the lower level of the second gate without exposing the first gate;

depositing a conductive material on the insulating layer aid into the opening in the insulating layer without depositing the conductive material on the first gate; and polishing the conductive material to remove the conductive material outside the opening in the insulating layer.

16. The method of claim 13, wherein forming the upper gate level includes:

depositing an insulating layer over the first gate and the lower level of the second gate;

forming an opening in the insulating layer that exposes the lower level of the second gate without exposing the first gate; and selectively depositing epitaxial silicon in the opening and on the lower level of the second gate without depositing the epitaxial silicon over the first gate.

17. The method of claim 9, wherein forming the first and second gates includes:

depositing a gate material on the gate insulator;

forming a masking layer over the gate material;

etching the gate material through openings in the masking layer to form a first pillar and the second gate, wherein the first pillar includes an upper level and the first gate, and the upper level of the first pillar provides a difference between the first and second thicknesses; and then removing the upper level of the first pillar to form the first gate.

18. The method of claim 17, wherein removing the upper level of the first pillar includes:

depositing a second masking layer over the first pillar and the second gate;

forming an opening in the second masking layer above the first pillar while the second masking layer covers the second gate; and etching the upper level of the first pillar through the opening in the second masking layer using the second masking layer as an etch mask for the second gate.

19. The method of claim 17, wherein removing the upper level of the first pillar includes:

depositing a second masking layer over the first pillar and the second gate;

removing a portion of the second masking layer above the first pillar while the second masking layer covers the second gate; and growing an oxide on the first pillar using the second masking layer to prevent oxide growth on the second gate, wherein the oxide consumes the upper level of the first pillar.

20. The method of claim 9, including:

forming first spacers adjacent to the first gate and second spacers adjacent to the second gate after implanting the lightly doped source and drain regions; and implanting a second dopant into the first and second gates and into the substrate to implant heavily doped source and drain regions in the first device region outside the first gate and first spacers and to implant heavily doped source and drain regions in the second device region outside the second gate and second spacers.

21. The method of claim 20, wherein implanting the second dopant into the first and second gates excludes implanting essentially any of the second dopant through the first gate into the first channel region and excludes implanting essentially any of the second dopant through the second gate into the second channel region.

22. The method of claim 20, wherein transferring the dopant from the first gate into the first channel region occurs after implanting the second dopant, excludes transferring essentially any of the second dopant from the first gate into the first channel region, and excludes transferring essentially any of the second dopant from the second gate into the second channel region.

23. The method of claim 20, including implanting the dopant at a first implant energy and implanting the second dopant at a second implant energy, wherein the first implant energy is substantially greater than the second implant energy.

24. The method of claim 9, wherein the first thickness is at most 1000 angstroms.

25. The method of claim 9, wherein the second thickness is at least 2000 angstroms.

26. The method of claim 9, wherein the second thickness is at least twice that of the first thickness.

27. The method of claim 9, wherein the gate insulator has essentially identical thicknesses beneath the first and second gates.

28. The method of claim 9, wherein the first and second gates are polysilicon.

29. A method of making enhancement-mode and depletion-mode IGFETs, comprising the steps of:

providing a semiconductor substrate with first and second device regions of first conductivity type;

forming a gate oxide on the first and second device regions;

forming a first gate composed of polysilicon with a first thickness on the gate oxide over the first device region;

forming a second gate composed of polysilicon with a second thickness on the gate oxide over the second device region, wherein the second thickness is at least twice that of the first thickness;

implanting a first dopant of second conductivity type into the first and second gates, into the first device region outside the first gate, and into the second device region outside the second gate, without implanting essentially any of the first dopant through the first gate, and without implanting essentially any of the first dopant through the second gate, to form first lightly doped source and drain regions of second conductivity type in the first device region, to form a first channel region of first conductivity type in the first device region beneath the first gate and adjacent to the first lightly doped source and drain regions, to form second lightly doped source and drain regions of second conductivity type in the second device region, and to form a second channel region of first conductivity type in the second device region beneath the second gate and adjacent to the second lightly doped source and drain regions, thereby providing enhancement-mode doping of first conductivity type for the first and second channel regions;

forming first spacers adjacent to opposing sidewalls of the first gate and second spacers adjacent to opposing sidewalls of the second gate;

implanting a second dopant of second conductivity type into the first and second gates, into the first device region outside the first gate and first spacers, and into the second device region outside the second gate and second spacers, without implanting essentially any of the second dopant through the first gate, and without implanting essentially any of the second dopant through the second gate, to form first heavily doped source and drain regions of second conductivity type in the first device region, and to form second heavily doped source and drain regions of second conductivity type in the second device region; and applying heat to drive-in and activate the first dopant and to diffuse a substantial amount of the first dopant from the first gate into the first channel region without diffusing essentially any of the first dopant from the second gate into the second channel region, thereby providing the first channel region with depletion-mode doping of second conductivity type while the second channel region retains enhancement-mode doping due to a difference between the first and second thicknesses.

30. The method of claim 29, wherein the first dopant provides essentially all depletion-mode doping for the first channel region.

31. The method of claim 29, including applying heat to drive-in and activate the second dopant without diffusing essentially any of the second dopant from the first gate into the first channel region and without diffusing essentially any of the second dopant from the second gate into the second channel region.

32. The method of claim 29, wherein forming the first and second gates includes:

depositing a polysilicon layer on the gate oxide;

forming a photoresist layer over the polysilicon layer;

etching the polysilicon layer through openings in the photoresist layer to form the first gate and a lower level of the second gate; and then forming an upper level of the second gate on the lower level of the second gate, wherein the upper level of the second gate provides a difference between the first and second thicknesses.

33. The method of claim 29, wherein forming the first and second gates includes:

depositing a polysilicon layer on the gate oxide;

forming a photoresist layer over the polysilicon layer;

etching the polysilicon layer through openings in the photoresist layer to form a first pillar and the second gate, wherein the first pillar includes an upper level and the first gate, and the upper level of the first pillar provides a difference between the first and second thicknesses; and then removing the upper level of the first pillar to form the first gate.

34. A method of making IGFETs with different threshold voltages, comprising the steps of:

providing a semiconductor substrate with first and second device regions;

forming a first gate with a first thickness over the first device region;

forming a second gate with a second thickness over the second device region, wherein the second thickness is substantially greater than the first thickness;

implanting a dopant into the substrate and into the first and second gates to implant source and drain regions in the first device region and source and drain regions in the second device region; and transferring a first amount of the dopant through the first gate into a first channel region in the first device region beneath the first gate and transferring a second amount of the dopant through the second gate into a second channel region in the second device region beneath the second gate, wherein the first amount is greater than the second amount, thereby providing a lower threshold voltage for the first channel region than the second channel region due to a difference between the first and second thicknesses.

35. The method of claim 34, wherein implanting the dopant includes transferring the dopant.

36. The method of claim 34, wherein transferring the dopant includes applying heat to diffuse the dopant after implanting the dopant.

37. The method of claim 34, wherein forming the first and second gates includes depositing a gate material over the substrate, etching the gate material to form the first gate and a lower level of the second gate, and then forming an upper level of the second gate on the lower level of the second gate to form the second gate.

38. The method of claim 34, wherein forming the first and second gates includes depositing a gate material over the substrate, etching the gate material to form a first pillar and the second gate, and then removing an upper level of the first pillar to form the first gate.

* * * * *